United States Patent
Appelt et al.

(10) Patent No.: US 8,309,400 B2
(45) Date of Patent: Nov. 13, 2012

(54) LEADFRAME PACKAGE STRUCTURE AND MANUFACTURING METHOD THEREOF

(75) Inventors: Bernd Karl Appelt, Gulf Breeze, FL (US); Kay Essig, Leipzig (DE); Yuan-Chang Su, Taoyuan County (TW); Chun-Che Lee, Kaohsiung (TW); Kuang-Hsiung Chen, Taoyuan County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 183 days.

(21) Appl. No.: 12/905,085

(22) Filed: Oct. 15, 2010

(65) Prior Publication Data
US 2012/0091569 A1   Apr. 19, 2012

(51) Int. Cl.
*H01L 21/00* (2006.01)
(52) U.S. Cl. ........ 438/123; 438/112; 438/126; 438/127; 257/E23.054; 257/E23.141

(58) Field of Classification Search .................. 438/112, 438/123, 126, 127, FOR. 369; 257/E23.054, 257/E23.141
See application file for complete search history.

(56) References Cited

U.S. PATENT DOCUMENTS

| | | | |
|---|---|---|---|
| 6,238,952 B1 * | 5/2001 | Lin ............................... | 438/110 |
| 6,306,685 B1 * | 10/2001 | Liu et al. ...................... | 438/121 |
| 2008/0150107 A1 * | 6/2008 | Tan et al. ...................... | 257/676 |
| 2009/0152707 A1 * | 6/2009 | How et al. ..................... | 257/690 |

* cited by examiner

*Primary Examiner* — Michelle Mandala
(74) *Attorney, Agent, or Firm* — Jianq Chyun IP Office

(57) ABSTRACT

The package structure includes a metal sheet having a first central block, a plurality of first metal blocks, a second central block and a plurality of second metal blocks, a first finish layer and a second finish layer, at least a chip disposed on the metal sheet and a package body encapsulating the chip. The package structure may further include at least an area block for wire routing.

21 Claims, 9 Drawing Sheets

FIG. 1F"

LEADFRAME PACKAGE STRUCTURE AND MANUFACTURING METHOD THEREOF

BACKGROUND OF THE INVENTION

1. Field of the Invention

The present invention generally relates to a package structure and a manufacturing process thereof. More particularly, the present invention relates to a leadframe package structure and a manufacturing process thereof.

2. Description of Related Art

For continuous growth in the RF/wireless, portable applications and PC peripheral markets, higher performance and increased I/O counts in a smaller package has have been greatly demanded. Advanced leadframe packaging, including quad flat no lead (QFN) packages and enhanced leadless leadframe-based packages, has become widely accepted and is suitable for the chip package with high-frequency (for example, radio frequency bandwidth) transmission.

Increasing demand for the advanced leadframe package structures prompts the industry to look for more efficient packaging methods. Moreover, as the number of I/O pads keeps increasing, the advanced leadframe package structures need to promote the electrical performances and product reliability.

SUMMARY OF THE INVENTION

The present invention is directed to a leadframe structure, a leadframe package structure and manufacturing methods thereof, which can simplify the process steps and enhance the product reliability.

The present invention provides a manufacturing method of a leadframe package structure. After providing a metal sheet having a top metal layer and a bottom metal layer, a first photoresist layer is formed on an upper surface of the metal sheet and the top metal layer is patterned. Then, a dielectric layer is laminated over the patterned top metal layer. A second photoresist layer is provided on a lower surface of the metal sheet and a metal layer is formed on the metal sheet, using the second photoresist layer as a mask. Later, at least a chip is disposed and electrically connected to the metal sheet or to the metal layer, and a package body is formed over the metal sheet or the metal layer to encapsulate the at least chip.

According to embodiments of the present invention, the chip is disposed either to the patterned top metal layer of the metal sheet or to the metal layer. When the chip is disposed to the patterned top metal layer, the patterned top metal layer further comprises at least an area block. When the chip is disposed to the metal layer, the metal layer further comprises at least an area block.

According to embodiments of the present invention, the bottom metal layer is partially removed before forming the metal layer and after providing the second photoresist layer, and the metal layer is formed directly on the patterned top metal layer.

According to embodiments of the present invention, the bottom metal layer is partially removed after forming the metal layer and after removing the second photoresist layer.

The present invention provides a manufacturing method of a leadframe package structure. After providing a metal sheet having a first photoresist layer formed on an upper surface of the metal sheet, a first metal layer having a plurality of first metal blocks is formed on the upper surface of the metal sheet using the first photoresist layer as a mask. Then, a dielectric layer is laminated over the first metal layer. After providing a second photoresist layer on a lower surface of the metal sheet, a second metal layer having a plurality of second metal blocks is formed on the lower surface of the metal sheet, using the second photoresist layer as a mask. Using the second metal layer as an etching mask, the metal sheet is patterned and at least a chip is disposed and electrically connected to the first metal layer or to the second metal layer. Later, a package body is formed over the first or second metal layer to encapsulate the at least chip.

According to embodiments of the present invention, the metal layer at the chip side may further include at least an area block beside the central block and between the metal blocks.

The present invention also provides a leadframe package structure having a metal sheet, at least a chip and a package body. The metal sheet comprises a first central block formed on the upper surface, a plurality of first metal blocks formed on the upper surface and surrounding the first central block, a second central block formed on the lower surface and a plurality of second metal blocks formed on the lower surface and surrounding the second central block. The chip is disposed on the first or second central block and is electrically connected the metal sheet. The package body encapsulates the chip and a portion of the metal sheet.

According to embodiments of the present invention, the locations of the first metal blocks correspond to the locations of the second metal blocks.

According to embodiments of the present invention, the chip is disposed either to the first or second central block. When the chip is disposed to the first central block, the metal sheet further comprises at least an area block formed on the upper surface of the metal sheet and beside the first central block. When the chip is disposed to the second central block, the metal sheet further comprises at least an area block formed on the lower surface of the metal sheet and beside the second central block.

However, the leadframe or package structure may be designed to have a central block with a cavity or even designed to be with or without the central block (functioning as the die pad), depending on the product requirements.

According to embodiments of the present invention, a dielectric layer is formed on the upper surface and fills between the first central block and the first metal blocks. The dielectric layer can be a predrilled prepreg layer, a resin coated copper (RCC) layer, a dry-film solder mask layer or a resin layer.

In order to make the above and other features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
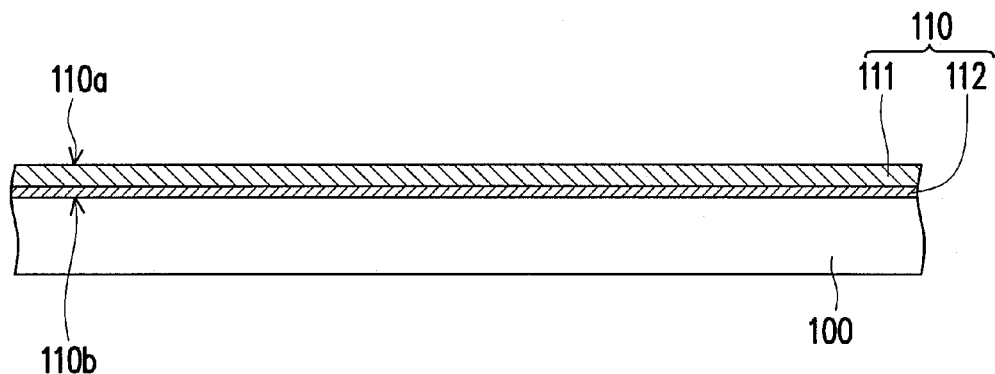
FIGS. 1A through 1I illustrate manufacturing processes of a leadframe package structure according to embodiments of the present invention.
Figure 1B:
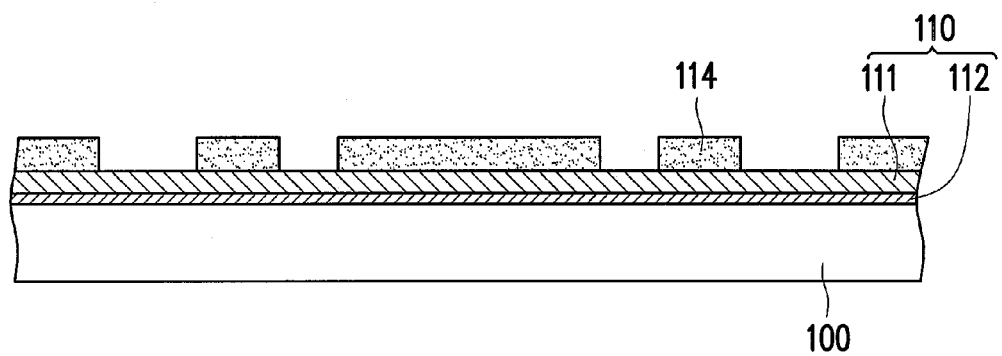

Reference will now be made in detail to the present preferred embodiments of the invention, examples of which are illustrated in the accompanying drawings. Wherever possible, the same reference numbers are used in the drawings and the descriptions to refer to the same or like parts.

FIGS. 1A through 1I illustrate manufacturing methods of a leadframe package structure according to embodiments of the present invention. FIGS. 1A-1I are shown in cross-sectional views, while FIG. 1F' is shown in the bottom view.

As shown in FIG. 1A, a metal sheet 110 having the upper surface 110a and the lower surface 110b is provided on a carrier 100. The metal sheet 110 can be, for example, a stacked film of a first metal layer 111 and a nickel layer 112. However, the first metal layer can be made of copper, a copper alloy, or other applicable metal materials. Next, referring to the FIG. 1B, a first photoresist layer 114 is formed on the upper surface 110a of the metal sheet 110. The first photoresist layers 114 can be formed by laminating a dry film resist layer (not shown) on the upper surface of the metal sheet 110, under exposure and then developed to form patterns in the dry film resist layer. It is understandable that the photoresist layers described herein may be provided with preformed patterns.

Figure 1C:
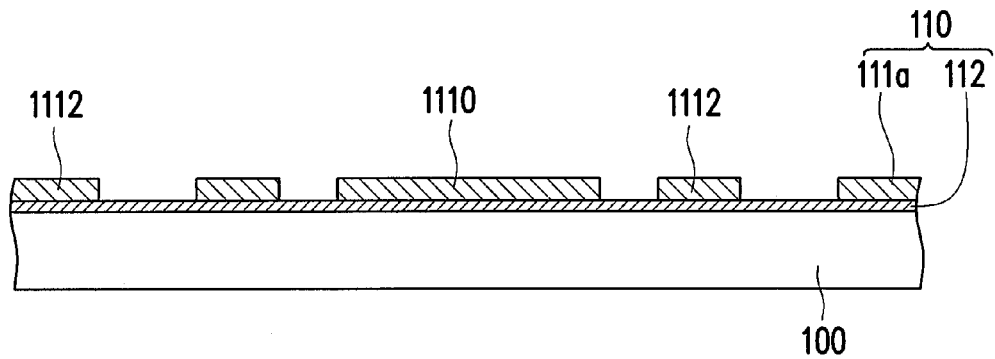

Next, referring to the FIG. 1C, using the first photoresist layer 114 as a mask, an etching process is performed to partially remove the first metal layer 111 of the metal sheet 110, so that a patterned first metal layer 111a is obtained. Due to the etching process, the sidewalls of the patterned first metal layer 111a may be curved. Optionally, a nickel/gold layer may be formed over the patterned first metal layer 111a by plating, as a surface coating layer. Then, the first photoresist layer 114 is removed.

Figure 1D:
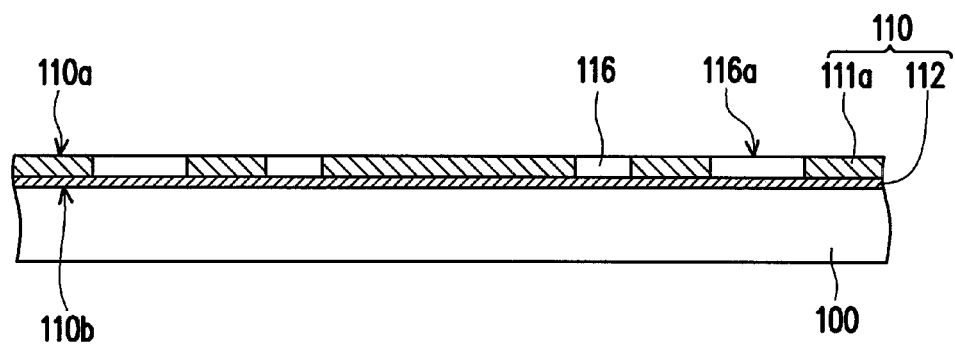

Later, as shown in FIG. 1D, a dielectric layer 116 is formed over the patterned first metal layer 111a and the nickel layer 112. The dielectric layer 116 fills up the patterns of the patterned first metal layer 111a. The upper surface 116a of the dielectric layer 116 is coplanar with the upper 111 as of the patterned first metal layer 111a. The dielectric layer 116 can be a predrilled prepreg layer, a resin coated copper (RCC) layer, a dry-film solder mask layer or a resin layer (such as, Ajinomoto build-up film (ABF) or Zeon), for example. The predrilled prepreg layer may have a pattern complementary to the pattern of the patterned first metal layer 111a. If the dielectric layer 116 is a RCC layer, the copper foil of the RCC layer will be etched after curing the resin of the RCC layer. The dielectric layer can reinforce the structural strength of the leadframe structure and provide good insulation.

Figure 1E:
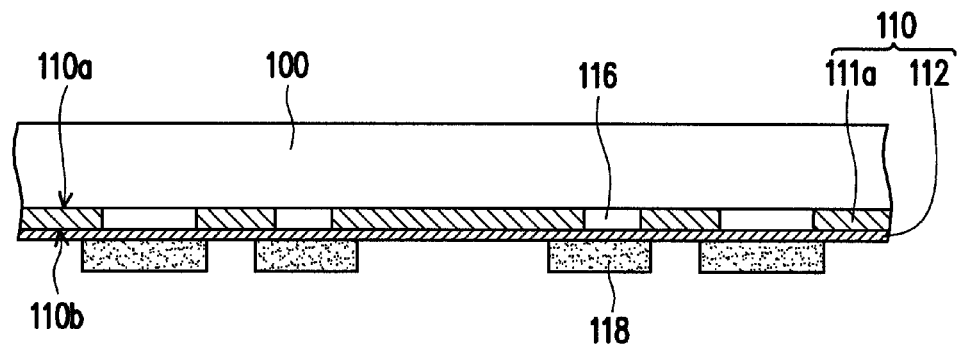

Referring to FIG. 1E, the carrier 100 is released from the lower surface 110b and re-applied to the upper surface 110a. That is, the carrier 100 is attached to the upper surface 116a of the dielectric layer 116 and the upper 111 as of the patterned first metal layer 111a. Then, a second photoresist layer 118 is formed on the lower surface 110b of the metal sheet 110. The second photoresist layers 118 can be formed by laminating a dry film resist layer (not shown) on the lower surface 110b of the metal sheet 110, under exposure and then developed to form patterns in the dry film resist layer.

Figure 1F:
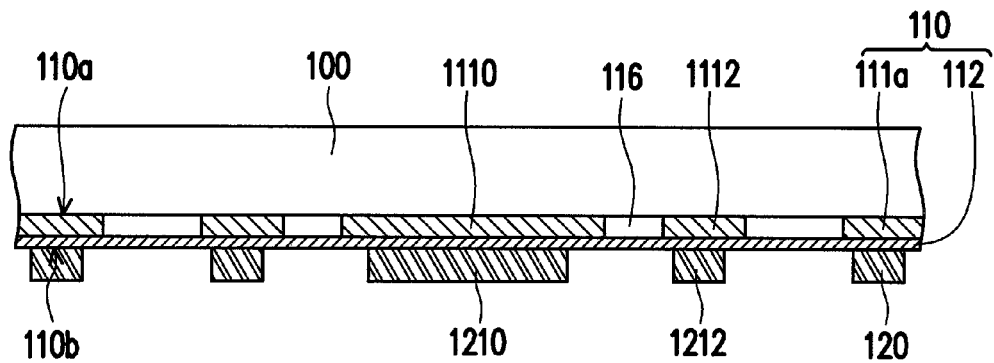
Figure 1F:
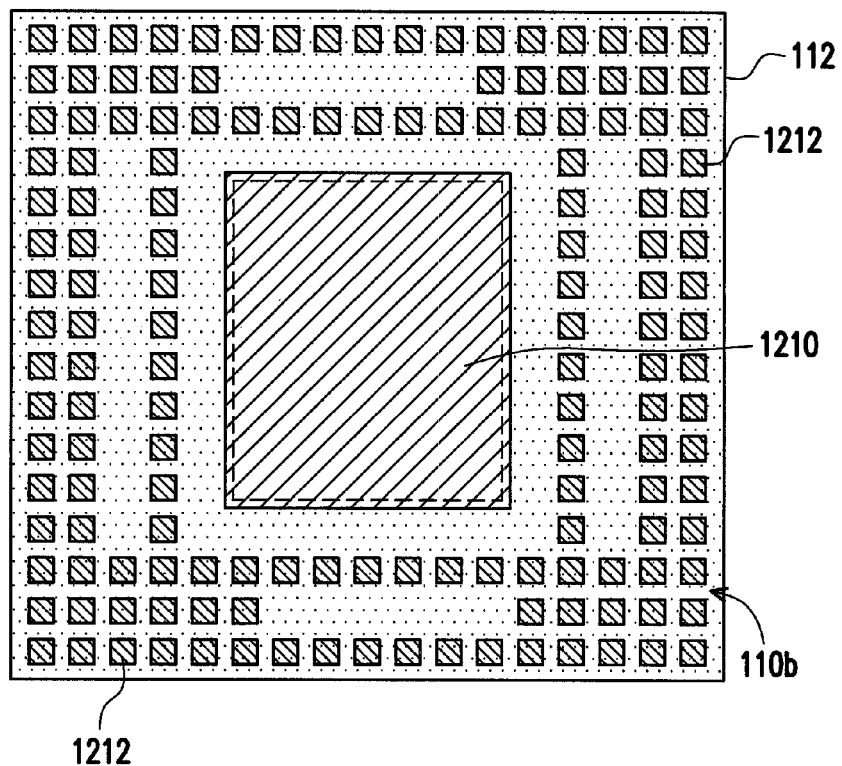

Referring to FIG. 1F, using the second photoresist layer 118 as a mask, a plating process is performed to form a second metal layer 120 on the lower surface 110b of the metal sheet 110 (i.e. on the nickel layer). Later, the second photoresist layer 118 is removed. Optionally, a nickel/gold layer may be formed over the second metal layer 120 by plating, as a surface coating layer before removing the second photoresist layer. The material of the second metal layer 120 can be copper or copper alloys, for example. In general, the pattern of the second metal layer 120 corresponds to that of the patterned first metal layer 111a in FIG. 1F. However, the pattern of the second metal layer 120 can be different to that of the patterned first metal layer 111a, depending on the product designs.

The patterned first metal layer 111a includes at least a first central block 1110 and a plurality of first metal blocks 1112 surrounding the first central block 1110 (FIG. 1C). The second metal layer 120 includes at least a second central block 1210 and a plurality of second metal blocks 1212 surrounding the second central block 1210 (FIG. 1F). The size of the first metal blocks may be larger (as shown in FIG. 1F), equivalent or smaller than that of the second metal blocks. The locations of the first metal blocks correspond to the locations of the second metal blocks, and the first/second metal blocks function as inner/outer leads. The first/second metal blocks may be arranged in rows, columns or arrays. From the bottom view, the shape of the second metal blocks 1212 may be square (as shown in FIG. 1F'), round or polygonal, for example. Depending on the arrangement of the chip, the first central block 1110 may function as the die pad and the second central block 1210 corresponding to the first central block 1110 may function as the heat sink, or vice versa. Preferably, no surface coating layer is formed on the first or second central block for avoiding delamination, if the first or second central block functions as the die pad.

Figure 1G:
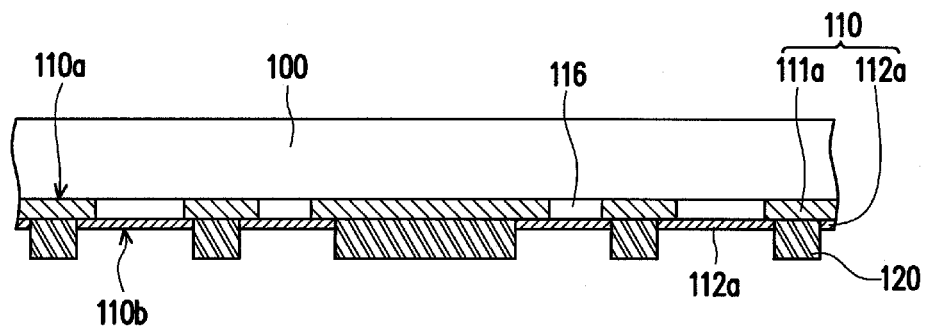
Figure 1G:
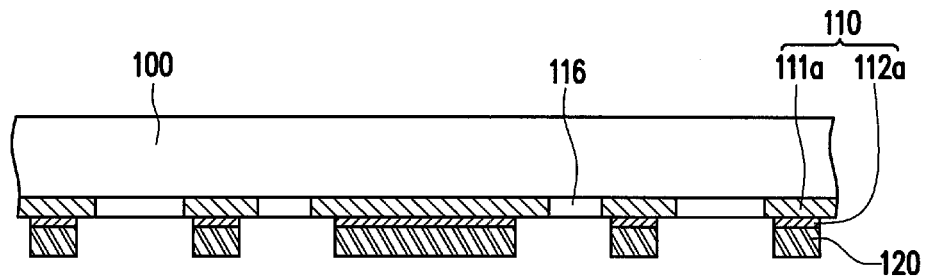

Referring to FIG. 1G, using the second metal layer 120 as an etching mask, the nickel layer 112 is partially removed to form a patterned nickel layer 112a. Alternatively, the nickel layer 112 may be patterned after forming the second photoresist layer 118 and before forming the second metal layer 120, so that the second metal layer 120 is formed directly on the patterned first metal layer 111a, as shown in FIG. 1F". In this case, as the nickel layer does not exist between the first and second metal layers, better electrical performance can be achieved. Later, the remained nickel layer is removed using the second metal layer 120 as the mask.

Figure 1H:
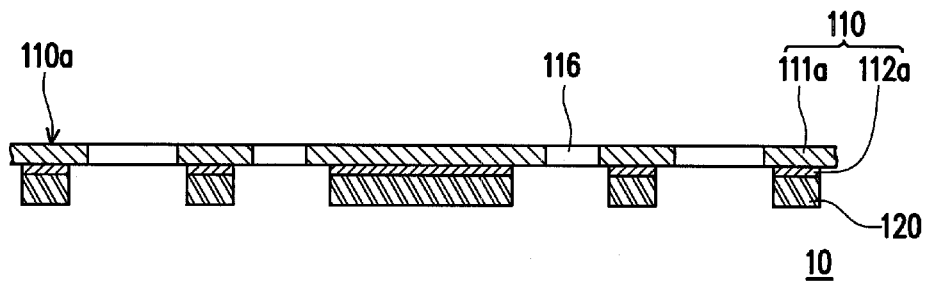

Later, following FIG. 1G and as shown in FIG. 1H, the carrier 100 is released and a leadframe structure 10 is obtained.

Figure 1I:
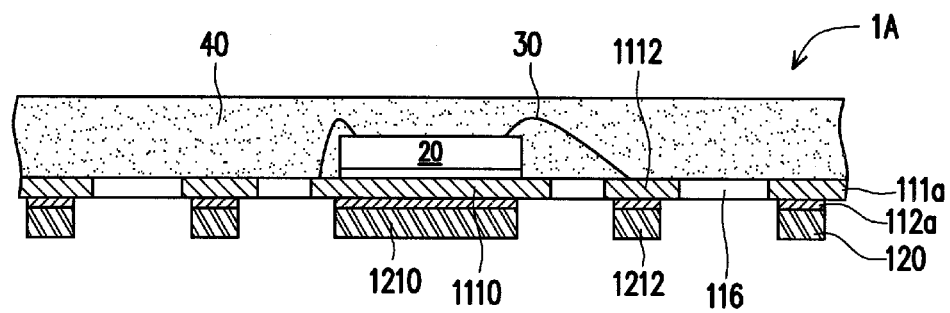

Referring to FIG. 1I, following FIGS. 1G & 1H, a chip 20 is provided to the first central block 1110 (as the die pad) and a plurality of wires 30 is formed between the chip 20 and first metal blocks 1112/die pad 1110. A package body 40 is then formed to encapsulant the chip 20 and the wires 30 and a leadframe package structure 1A is thus obtained. A material of the package body 40 is, for example, epoxy resins or other applicable polymer material.

Depending on the product design, the metal layer not at the chip side (in the above embodiment, the second metal layer) can be of a larger thickness if bigger standoff heights for the next level connection are desirable.

Figure 2:
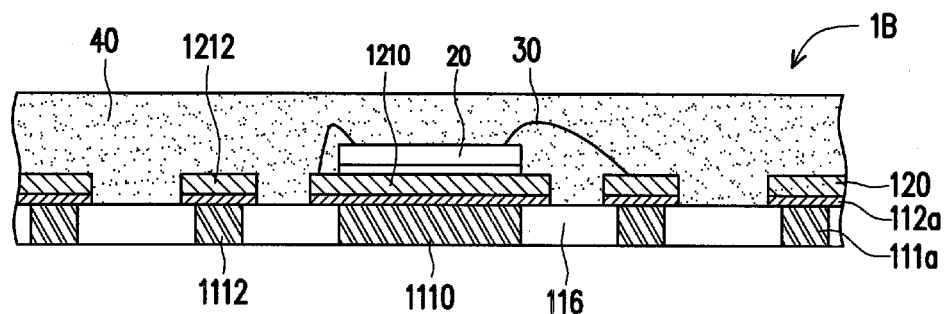
FIG. 2 shows a schematic cross-sectional view of one example of the package structure.

As discussed above, the size of the first metal blocks may be smaller than that of the second metal blocks. FIG. 2 shows a schematic cross-sectional view of one example of the package structure following the above manufacturing steps, except the size of the first metal blocks may be smaller than that of the second metal blocks. Referring to FIG. 2, a package structure 1B includes a chip 20 disposed on the second central block 1210 (as die pad), and a plurality of wires 30 is connected between the chip 20 and the die pad/the second metal blocks 1212. The package body 40 encapsulates the chip 20, the wires 30 and the second metal layer 120.

On the other hand, for shortening the wiring length, the patterned first metal layer 111a may have a pattern different to that of the second metal layer 120.

Figure 3A:
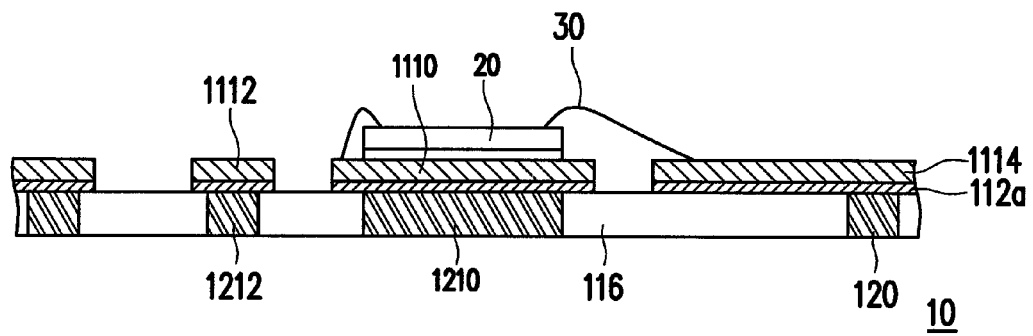
FIG. 3A shows a schematic cross-sectional view of one example of the package structure according to an embodiment of the present invention.
Figure 3B:
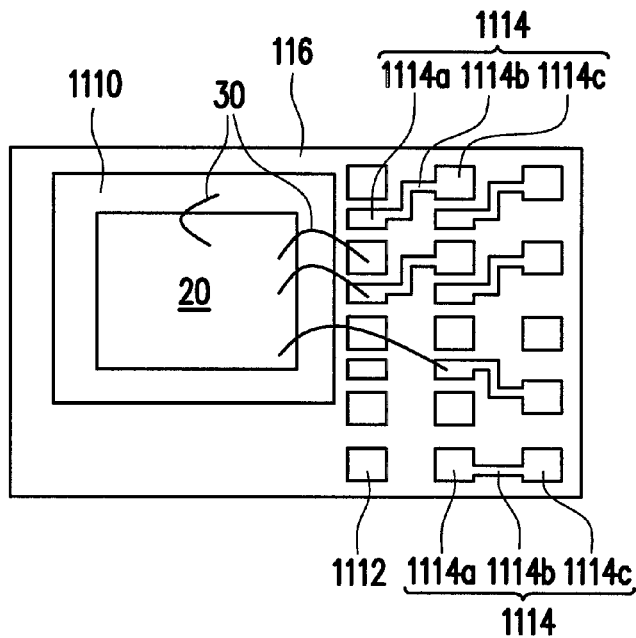
FIG. 3B is an exemplary top view of a portion of the package structure of FIG. 3A.

In addition to the first central block 1110 (as die pad) and a plurality of first metal blocks 1112 surrounding the first central block 1110, the patterned first metal layer 111a of the metal leadframe 10 further includes one or more area blocks 1114 beside the first central block 1110 and between the first metal block 1112, as shown in FIGS. 3A-3B. FIG. 3B shows a portion of the structure of FIG. 3A from a top view without forming the package body.

The area blocks 1114 and the first metal blocks 1112 (as contact terminals or leads) are disposed around the die pad 1110, and only three columns/rows of the contact terminals are schematically depicted. However, the arrangement or the shapes of the leads (contact terminals) should not be limited by the exemplary drawings and may be modified according to the product requirements. Specifically, as shown in FIG. 3B, the area blocks 1114 includes an inner enlarged portion 1114a (closer to the central block)), an outer enlarged portion 1114c (farer to the central block) and an elongated portion 1114b connecting the inner and outer enlarged portions. As depicted herein, at least two types of the elongated portions 1114b (zigzag and straight-line) are shown, so that the inner and outer enlarged portions are disposed at two different columns. In principle, the area blocks are arranged at the chip side (the side where the chip is disposed) for wire routing.

In this embodiment, the area blocks can function as routable area lands or leads. The routable area leads not only can shorten the wiring length for better electrical properties but also can provide design flexibility for better product customization.

Being comprehensible to the artisan, it is beneficial for the leadframe structure to include the area block at the chip side (the side where the chip set and molded), rather than the back side.

FIGS. 4A through 4G illustrate manufacturing methods of a leadframe structure according to another embodiment of the present invention.

Figure 4A:
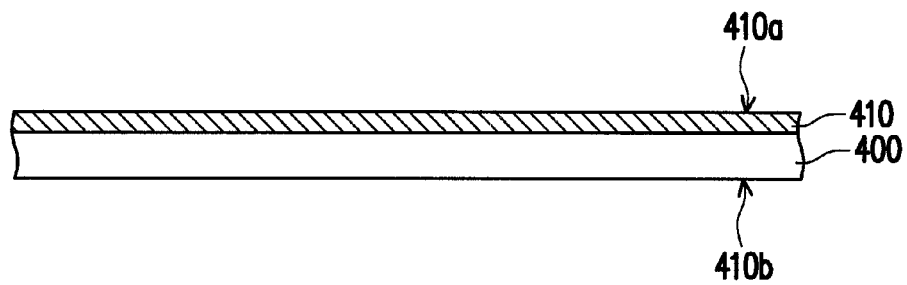
FIGS. 4A through 4G illustrate manufacturing processes of a leadframe structure according to another embodiment of the present invention.
Figure 4B:
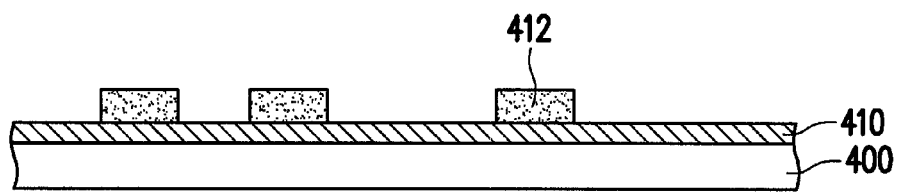

As shown in FIG. 4A, a metal sheet 410 having the upper surface 410a and the lower surface 410b is provided on a carrier 400. The metal sheet 410 can be made of copper, a copper alloy, or other applicable metal materials. Next, referring to the FIG. 4B, a first photoresist layer 412 is formed on the upper surface 410a of the metal sheet 410. The first photoresist layers 412 can be formed by laminating a dry film resist layer (not shown) on the upper surface of the metal sheet 410, under exposure and then developed to form patterns in the dry film resist layer.

Figure 4C:
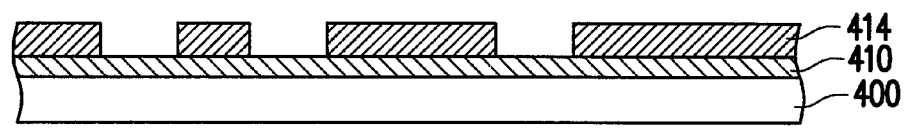

Next, referring to the FIG. 4C, using the first photoresist layer 412 as a mask, a plating process is performed to form a first metal layer 414. The first metal layer 414 can be a copper layer or a copper alloy layer, for example. Optionally, a nickel/gold layer may be formed over the first metal layer 414 by plating, as a surface coating layer. Then, the first photoresist layer 412 is removed.

Figure 4D:
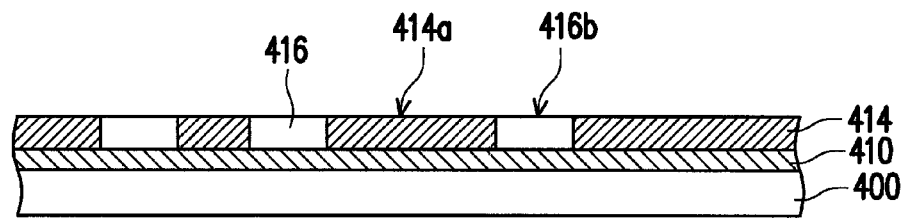

Later, as shown in FIG. 4D, a dielectric layer 416 is formed over the first metal layer 414 and the metal sheet 410. The dielectric layer 416 fills up the patterns of the first metal layer 414. The upper surface 416a of the dielectric layer 416 is coplanar with the upper 414a of the first metal layer 414. The dielectric layer 416 can be a predrilled prepreg layer, a resin coated copper (RCC) layer, a dry-film solder mask layer or a resin layer (such as, Ajinomoto build-up film (ABF) or Zeon), for example. The predrilled prepreg layer may have a pattern complementary to the pattern of the first metal layer 414. If the dielectric layer 416 is a RCC layer, the copper foil of the RCC layer will be etched after curing the resin of the RCC layer.

Figure 4E:
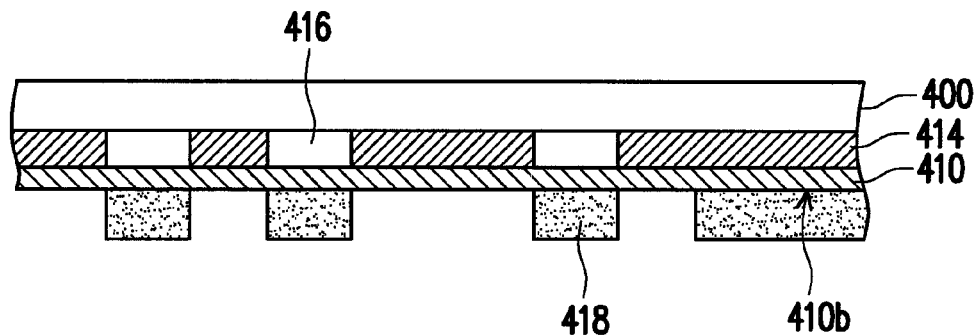

Referring to FIG. 4E, the carrier 400 is released from the lower surface 410b and re-applied to the upper surface 414a/416a. That is, the carrier 400 is attached to the upper surface 416a of the dielectric layer 416 and the upper 414a of the first metal layer 414. Then, a second photoresist layer 418 is formed on the lower surface 410b of the metal sheet 410. The second photoresist layers 418 can be formed by laminating a dry film resist layer (not shown) on the lower surface 410b of the metal sheet 410, under exposure and then developed to form patterns in the dry film resist layer.

Figure 4F:
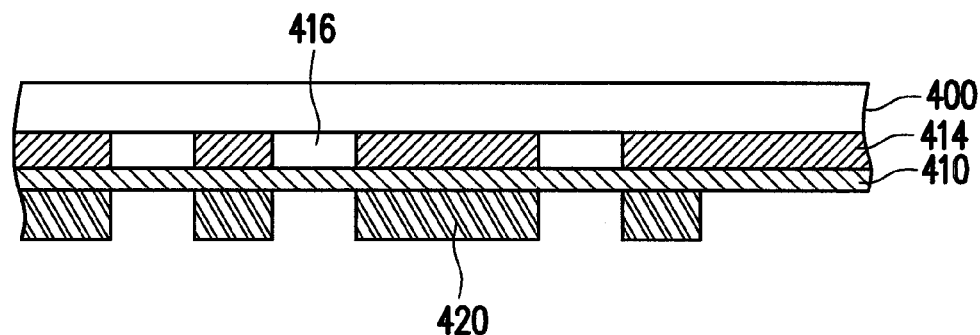

Referring to FIG. 4F, using the second photoresist layer 418 as a mask, a plating process is performed to form a second metal layer 420 on the lower surface 410b of the metal sheet 410. Later, the second photoresist layer 418 is removed. Optionally, a nickel/gold layer may be formed over the second metal layer 420 by plating, as a surface coating layer before removing the second photoresist layer. The material of the second metal layer 420 can be copper or copper alloys, for example. In FIG. 4F, the pattern of the second metal layer 420 is different to that of the first metal layer 414, for providing routable area leads.

Figure 4G:
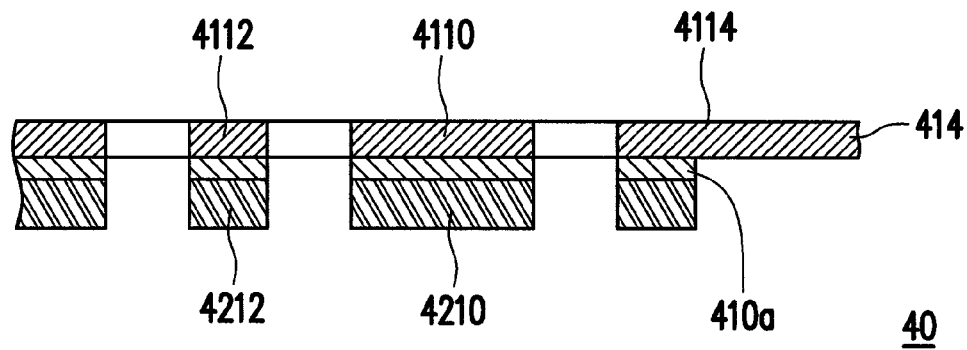

Referring to FIG. 4G, using the second metal layer 420 as an etching mask, the metal sheet 410 is partially removed to form a patterned metal sheet 410a. Later, the carrier 400 is released and a leadframe structure 40 is obtained.

The first metal layer 414 includes at least a first central block 4110, one or more area blocks 4114 and a plurality of first metal blocks 4112 surrounding the first central block 4110. The second metal layer 420 includes at least a second central block 4210 and a plurality of second metal blocks 4212 surrounding the second central block 4210. The size of the first metal blocks may be larger, equivalent or smaller than that of the second metal blocks. The size of the area block 4114 is larger than that of the first/second metal block. The second metal blocks may correspond to the first metal blocks or the area blocks in one-to-one fashion.

Figure 5A:
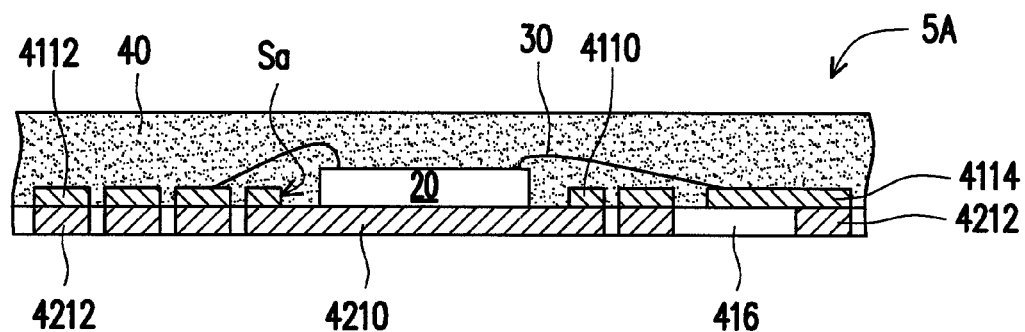
FIGS. 5A-5B show schematic cross-sectional views of examples of the leadframe package structure.
Figure 5B:
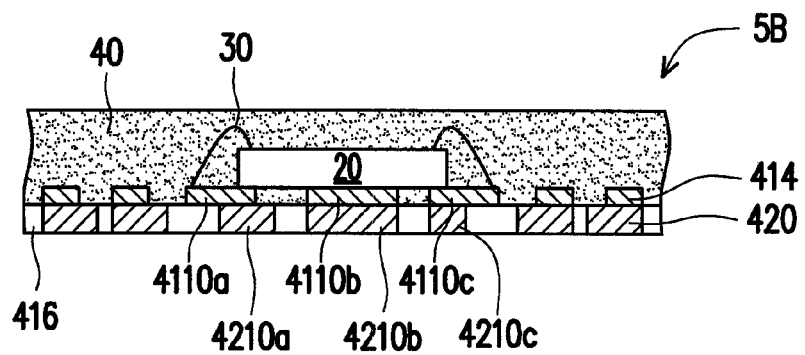

FIGS. 5A-5B show schematic cross-sectional views of examples of the package structure. As shown in FIG. 5A, the chip 20 is disposed on the first central block 4110 (function as the die pad) of the first metal layer 414 with a central cavity Sa. The central cavity Sa is large enough to accommodate the chip 20, which can help reduce the package height of the package 5A. Alternatively, multiple chips or stacked chips may be applied or the first metal layer 414 may even be designed to be without the first central block and the chip is disposed directly on the underlying second central block of the second metal layer 420.

As shown in FIG. 5B, for better heat dissipation, the first central block 4110 can be split into a plurality of pad blocks 4110a/4110b/4110c, and the second central block 4210 can be split into a plurality of pad blocks 4210a/4210b/4210c. The chip 20 is disposed over the plurality of pad blocks 4110a/4110b/4110c.

From the above embodiments of the manufacturing processes, the etching process is performed during the fabrication of the leadframe structure and before disposing the chip. Compared with the conventional process for QFN packages, the product reliability of the leadframe package is better as no etching process is performed during or after assembling the package.

For the package structures according to the above embodiments, routable area blocks can be easily arranged at the chip side, which can help shorten the wiring length and greatly improves the design flexibility depending on product requirements. In addition, the dielectric layer applied can greatly enhance the package strength.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a semiconductor leadframe package structure, comprising:
    providing a metal sheet having a first photoresist layer formed on an upper surface of the metal sheet, wherein the metal sheet comprises a top metal layer and a bottom metal layer;
    patterning the top metal layer;
    removing the first photoresist layer;
    laminating a dielectric layer over the patterned top metal layer;
    providing a second photoresist layer on a lower surface of the metal sheet;
    forming a metal layer on the metal sheet, using the second photoresist layer as a mask;
    removing the second photoresist layer;
    partially removing the bottom metal layer;
    disposing and electrically connecting at least a chip to the metal sheet or to the metal layer; and
    forming a package body over the metal sheet or the metal layer to encapsulate the at least chip.

2. The method of claim 1, wherein the metal layer is a copper layer formed by performing a plating process.

3. The method of claim 1, wherein the top metal layer is a copper layer and the bottom metal layer is a nickel layer.

4. The method of claim 1, wherein the dielectric layer is a predrilled prepreg layer, a resin coated copper (RCC) layer, a dry-film solder mask layer or a resin layer.

5. The method of claim 1, wherein disposing the chip to a first central block of the patterned top metal layer and the patterned top metal layer comprises at least an area block beside the first central block and a plurality of first metal blocks surrounding the first central block.

6. The method of claim 1, wherein disposing the chip to a second central block of the metal layer and the metal layer comprises at least an area block beside the second central block and a plurality of second metal blocks surrounding the second central block.

7. The method of claim 1, wherein the bottom metal layer is partially removed before forming the metal layer and after providing the second photoresist layer, and the metal layer is formed directly on the patterned top metal layer.

8. The method of claim 1, wherein the bottom metal layer is partially removed after forming the metal layer and after removing the second photoresist layer.

9. The method of claim 5, wherein a first nickel/gold layer is formed on the patterned top metal layer except for the first central block before removing the first photoresist layer.

10. The method of claim 6, wherein a second nickel/gold layer is formed on the metal layer except for the second central block before removing the second photoresist layer.

11. A manufacturing method of a leadframe package structure, comprising:
    providing a metal sheet having a first photoresist layer formed on an upper surface of the metal sheet;
    forming a first metal layer having a plurality of first metal blocks on the upper surface of the metal sheet using the first photoresist layer as a mask;
    removing the first photoresist layer;
    laminating a dielectric layer over the first metal layer;
    providing a second photoresist layer on a lower surface of the metal sheet;
    forming a second metal layer having a plurality of second metal blocks on the lower surface of the metal sheet, using the second photoresist layer as a mask;
    removing the second photoresist layer;
    using the second metal layer as an etching mask, patterning the metal sheet;
    disposing and electrically connecting at least a chip to the first metal layer or to the second metal layer; and
    forming a package body over the first or second metal layer to encapsulate the at least chip.

12. The method of claim 11, wherein the first metal layer or the second metal layer is a copper layer formed by performing a plating process.

13. The method of claim 11, wherein the dielectric layer is a predrilled prepreg layer, a resin coated copper (RCC) layer, a dry-film solder mask layer or a resin layer.

14. The method of claim 11, wherein disposing the chip to a first central block of the first metal layer and the first metal layer further comprises at least an area block beside the first central block and between the first metal blocks surrounding the first central block.

15. The method of claim 11, wherein disposing the chip to a second central block of the second metal layer and the second metal layer further comprises at least an area block beside the second central block and between the second metal blocks surrounding the second central block.

16. The method of claim 14, wherein a first nickel/gold layer is formed on the first metal layer except for the first central block before removing the first photoresist layer.

17. The method of claim 15, wherein a second nickel/gold layer is formed on the second metal layer except for the second central block before removing the second photoresist layer.

18. The method of claim 9, wherein a second nickel/gold layer is formed on the metal layer before removing the second photoresist layer.

19. The method of claim 10, wherein a first nickel/gold layer is formed on the patterned top metal layer before removing the first photoresist layer.

20. The method of claim 16, wherein a second nickel/gold layer is formed on the second metal layer before removing the second photoresist layer.

21. The method of claim 17, wherein a first nickel/gold layer is formed on the first metal layer before removing the first photoresist layer.

* * * * *